US006867508B2

(12) United States Patent
Tamaishi et al.

(10) Patent No.: US 6,867,508 B2
(45) Date of Patent: Mar. 15, 2005

(54) METHOD AND APPARATUS FOR FABRICATING SEMICONDUCTOR LASER DEVICE

(75) Inventors: Masayuki Tamaishi, Kashihara (JP); Hiroshi Kanishi, Osaka (JP); Yoshiyuki Itoh, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 249 days.

(21) Appl. No.: 10/134,534

(22) Filed: Apr. 30, 2002

(65) Prior Publication Data

US 2002/0142502 A1 Oct. 3, 2002

Related U.S. Application Data

(62) Division of application No. 09/891,459, filed on Jun. 27, 2001, now Pat. No. 6,440,758.

(30) Foreign Application Priority Data

Jun. 28, 2000 (JP) .................................. 2000-194317
May 17, 2001 (JP) .................................. 2001-148083

(51) Int. Cl.$^7$ ............................................. H01L 23/58
(52) U.S. Cl. ...................... 257/798; 438/455; 438/406
(58) Field of Search .................................. 438/455, 406

(56) References Cited

U.S. PATENT DOCUMENTS 4,817,849 A   4/1989   Yamamoto et al.

FOREIGN PATENT DOCUMENTS

| JP | 63-67793 A | 3/1988 |
|----|------------|--------|
| JP | 5-335355 A | 12/1993 |
| JP | 07-202347  | 8/1995 |

OTHER PUBLICATIONS

Japanese Office Action mailed Oct. 28, 2003 in corresponding Japanese application No. 2001-148083.

*Primary Examiner*—Long Pham
(74) *Attorney, Agent, or Firm*—Nixon & Vanderhye, P.C.

(57) ABSTRACT

After profiles of two chips are recognized on intermediate stages and their positions are corrected, collets are used as electrodes and a voltage is applied to the chips on bonding stage on which the chips are bonded onto a submount. Then, the respective two chips are allowed to emit light, final position correction is performed on the basis of the light-emission point data and bonding is performed. The two chips can be bonded at narrow pitches by tilting the collets with respect to chip surfaces. Consequently, two laser chips can be bonded at narrow pitches on one submount in high position accuracy.

9 Claims, 15 Drawing Sheets

LIGHT-EMISSION POINT
REFERENCE LINE x

LIGHT-EMISSION POINT
REFERENCE LINE x

POSITION WHERE SMALLEST BEAM
DIAMETER IS OBTAINED y1

LIGHT-EMISSION POINT
REFERENCE LINE x

PEAK POSITION x2

ENLARGED BY SIX TIMES

METHOD AND APPARATUS FOR FABRICATING SEMICONDUCTOR LASER DEVICE

This application is a division of application Ser. No. 09/891,459, filed Jun. 27, 2001, now U.S. Pat. No. 6,440,758, the entire content of which is hereby incorporated by reference in this application.

BACKGROUND OF THE INVENTION

The present invention relates to an apparatus and a method for bonding two semiconductor laser chips at narrow pitches on one submount in high accuracy. The present invention is utilized in an apparatus for bonding the two laser chips (for example, combination of a red chip and an infrared chip or the like) such as a combination laser die-bonder or the like.

One example of a conventional one-chip bonding apparatus is explained below. Conventionally, a semiconductor laser chip 4 is vacuum-sucked by using a vertically provided vacuum-suction collet 6, peeled from a wafer sheet 1, transferred to an intermediate stage 2 and passed as shown in FIGS. 1 and 2. On the intermediate stage 2, a chip profile is recognized by image processing and then, a light-emission axis is recognized. A chip position is corrected in X, Y and θ directions on the basis of this data.

After the chip position is corrected in the X, Y and θ directions on the intermediate stage 2, the chip is sucked again by using the suction collet 6 and transferred onto a submount 5 placed on a bonding stage 3. The chip is bonded onto the submount 5 as it is with an adhesive or by thermo-compression bonding.

That is, the chip position is corrected only on the intermediate stage in the above-described conventional one-chip bonding apparatus. Therefore, when the chip is passed to the submount by using the collet after the position correction on the intermediate stage and the chip is mounted on the submount, a fine shift occurs. Thus, bonding position accuracy according to a specification (±2 μm or less) could not be ensured, thereby resulting in variations in a laser direction.

A method of efficiently fabricating a semiconductor laser without variations in a light-emitting direction in a die-bonding process of a semiconductor laser is disclosed in Japanese Patent Laid-Open Publication No. 7-202347. In this method, a laser chip is energized and allowed to emit light on the intermediate stage by using a probe. A light-emission axis direction is measured by image processing and the laser chip position is corrected on the basis of the measured value. When the light-emission axis direction is within a certain error range, the laser chip is sucked and transferred by a laser chip feed mechanism for die-bonding. Thus, the chip position accuracy is improved.

When a two-chip semiconductor laser device is fabricated, two kinds of light-emitting chips having different wavelengths are bonded on one submount with favorable accuracy. The chips 12, 13 are bonded one by one in FIG. 3A. When the second chip 13 is bonded, heat is applied to the first already bonded chip 12 at its junction and the clip 12 comes off. Therefore, the two chips need to be bonded at the same time.

In FIG. 3B, two conventional collets are simply arranged in a mirror image to constitute a two-chip bonding by using the one-chip bonding apparatus in FIG. 2 so that two laser chips are die-bonded on a submount.

Since a specification for a distance between light-emission points is 100±2 μm in the two-chip semiconductor laser device, the chips need to be bonded so that a distance between the respective light-emission points 14, 15 of the two laser chips 12, 13 is 100±2 μm as shown in FIG. 4. It is shown, however, that, since the collets are vertically disposed in a constitution shown in FIG. 3B, the collets interfere with each other and thereby the two chips cannot be bonded closely.

In the method disclosed in Japanese Patent Laid-open Publication No. 7-202347 as well, it is shown that, since the collets are vertically disposed, the collets interfere with each other and thereby the two chips cannot be bonded closely.

To prevent the collets from interfering with each other in the constitution where the collets are vertically disposed, a diameter of the main body of a collet might be made thinner than the chip profile. However, currently the diameter of the main body of the collet cannot be made thinner than the chip profile because a vacuum hole for vacuum-sucking a chip needs to be provided, rigidity larger than a certain level is required due to a load applied upon chip suction and chip bonding and the collet needs to be shaped so that position accuracy in attachment/replacement of the collet can be easily ensured.

As described above, when the above conventional devices are simply arranged laterally in a mirror image when a semiconductor laser device in which two laser chips are die-bonded on a submount is fabricated, there are disadvantages described below.

(1) Since the position is corrected only on the intermediate stage, a fine shift occurs after the correction on the intermediate stage when the chip is passed by using a collet or the chip is placed on the submount.

(2) The specification required distance (x in FIG. 4) between the light-emission points of the two chips is as narrow as 100 μm. Therefore, when the two chips are bonded at the same time, the normal vertical collets interfere with each other and thereby the two chips cannot be bonded at desired positions at the same time even if the light-emission point is positioned as closely to an end of the chip as possible.

SUMMARY OF THE INVENTION

The present invention was accomplished from the above viewpoints. Accordingly, an object of the present invention is to provide an apparatus and a method for bonding two semiconductor laser chips on one submount at narrow pitches in high accuracy.

In order to achieve the above object, there is provided a method of fabricating a semiconductor laser device wherein two semiconductor laser chips are die-bonded on one submount, comprising processes of placing the semiconductor laser chips on intermediate stages, allowing the semiconductor laser chips on the submount to emit light and measuring light-emission point positions and transferring the semiconductor laser chips through fixed points to prescribed positions on the submount.

That is, in the present invention, a position of each semiconductor laser chip is corrected by profile recognition and light-emission axis recognition on the intermediate stage, a voltage is applied to each chip by using a collet as an electrode on a bonding stage for bonding the chip on the submount to allow each of the two chips to emit light, the light-emission point position data is subjected to image processing, the position of each of the two chips is finally corrected by a high-resolution precision positioning mechanism driven by a piezo-electric element of a bonding head on the basis of the data and then bonding is performed. Thus, according to the fabricating method of the present invention, a two-chip semiconductor laser device can be fabricated in high bonding accuracy.

In one embodiment of the present invention, the method comprises a process of measuring light-emission point positions and light-emission axis directions of the semiconductor laser chips placed on the intermediate stages.

In one embodiment of the present invention, the method comprises a process of correcting positions and directions of the intermediate stages on the basis of the results of measuring the light-emission point positions and light-emission axis directions of the semiconductor laser chips placed on the intermediate stages.

In one embodiment of the present invention, the method comprises processes of sucking the two semiconductor laser chips from respective wafer sheets or a chip tray by using collets, transferring the collets through fixed points by a fixed-point transfer movement mechanism and placing the two semiconductor laser chips on the respective intermediate stages, correcting positions of the two semiconductor laser chips on the respective intermediate stages, sucking the two semiconductor laser chips again, transferring the chips through fixed points and mounting the chips on the submount, energizing the two semiconductor laser chips on the submount to allow the chips to emit light and measuring a distance between the light-emission points of the two chips.

In one embodiment of the present invention, the method comprises a process of transferring the two semiconductor laser chips onto the submount through fixed points and then correcting the chip positions on the basis of the measured distance between the light-emission points by a movement mechanism for fine XY movement provided separately from the fixed-point transfer movement mechanism.

Therefore, according to the present invention, two chips are once placed on respective intermediate stages, a profile and a light-emission axis of each chip are recognized by a camera, the chip position is corrected by image processing and the chip whose position is corrected is transferred onto a submount through fixed points from left and right. Therefore, a shift on the submount occurs only when the chip is passed after the profile recognition. Therefore, light-emission points of the two chips can be easily recognized even in a narrow visual field of a high-magnification camera.

When the chip position is not corrected on the intermediate stage, the two chips may hit each other due to a large shift upon pickup of the chips since the gap between the two chips is narrow. However, this can be prevented.

Since the distance between the light-emission points of the two chips on the submount is measured to confirm that the chips are at prescribed positions and then thermocompression bonding is performed, bonding can be performed in high accuracy.

That is, according to the present invention, positions of the two semiconductor laser chips are corrected on the intermediate stages by image processing. Since the distance between light-emission points of the two semiconductor laser chips is further measured on the submount to correct the positions, bonding can be performed with a more accurate distance between the two chips as compared with a conventional method wherein the chip position is corrected only on the intermediate stage.

When no problem occurs upon the above-described pickup of the chip, the position can be roughly corrected on the intermediate stage. Consequently, a process time can be shortened on the intermediate stage so that the apparatus tact can be shortened.

In one embodiment of the present invention, the method comprises processes of allowing the two semiconductor laser chips to emit light on the submount at the same time, measuring a distance between light-emission points and using one light-emission point as a reference and moving the other chip to a prescribed position on the basis of the measurement data.

According to the above embodiment, bonding can be performed accurately and the apparatus can be constituted at a relatively low cost, since only one chip bonding head needs to have a fine adjustment mechanism.

In one embodiment of the present invention, the method comprises a process of allowing the two semiconductor laser chips to emit light on the submount, measuring a distance between the light-emission points and moving both the chips to prescribed positions by using light-emission point positions predetermined for both the semiconductor laser chips as references on the basis of the measurement data.

According to the above embodiment, bonding can be performed accurately and, by providing both the chip bonding heads with a fine adjustment mechanism, not only a relative position between the two chips, but also an absolute position of each laser chip with respect to the submount can be determined in high accuracy.

Also, there is provided a two-chip bonding apparatus for die-bonding two semiconductor laser chips on one submount, having intermediate stages for correcting positions and directions of the semiconductor laser chips, a bonding stage for placing a submount on which the semiconductor laser chips are bonded, means for allowing the two semiconductor laser chips to emit light at the same time on the submount placed on the bonding stage, means for measuring a distance between light-emission points of the two semiconductor laser chips and means for transferring the two semiconductor laser chips through fixed points to prescribed positions on the submount.

In one embodiment of the present invention, the apparatus has collets for sucking the semiconductor laser chips, a fixed-point transfer movement mechanism which is connected to collet heads of the collets to move the collets, means for recognizing profiles of the semiconductor laser chips on the intermediate stage, means for recognizing light emission axes of the semiconductor laser chips on the intermediate stages, a drive mechanism for correcting positions and directions of the intermediate stages, means for allowing the two semiconductor laser chips to emit light at the same time on the submount placed on the bonding stage and means for measuring a distance between light-emission points of the two semiconductor laser chips, and which corrects positions of the two semiconductor laser chips on the submount and then performs bonding.

The conventional collets are vertically disposed as shown in FIGS. 1 and 2. On the other hand, in the present invention, the collets are disposed while tilted towards both the front and lateral directions of the device as shown in FIG. 5A so that the collets do not interfere with each other upon die-bonding of two chips. Thus, die-bonding can be performed in favorable accuracy with a gap between the light-emission points of 100 μm.

Therefore, a tilted-type collet 16 whose end is ground so as to be in parallel to the chip surface was developed in the present invention so that a chip could be sucked while the collet is tilted. FIG. 6 shows an enlarged view of the end portions of the tilted-type collets of the present invention.

In such an eccentric-type collet 17 as shown in FIG. 5B, die-bonding can be similarly performed in favorable accuracy with a gap between the light-emission points of 100 $\mu$m. This eccentric-type collet 17 is obtained by soldering an eccentric block to a conventional collet to deviate the collet end from the center. Thus, collets are prevented from interfering with each other.

In one embodiment of the present invention, a piezo-electric element precision drive mechanism for fine XY movement is separately connected to the collet heads separately from the fixed-point transfer movement mechanism.

According to the above embodiment, in each of the bonding heads for a red chip and an infrared chip, a precision positioning mechanism (a piezo-electric element precision drive mechanism is further provided on a block driven by a ball screw in the XY direction and the collet is disposed at its ends.

In one embodiment of the present invention, the piezo-electric element precision drive mechanism is driven on the basis of the measured light-emission point distance data.

In one embodiment of the present invention, the collets are tilted-type collets, the two tilted-type collets are attached as opposed to each other and the two semiconductor laser chips can be die-bonded at the same time by using the two tilted-type collets.

According to the above embodiment, the two respective semiconductor laser chips can be made close to each other while vacuum-sucked. Thus, two-chip die-bonding with a fine gap can be achieved.

That is, in the two-chip bonding apparatus according to the present invention, chips are transferred through fixed points onto the submount by using the opposed tilted-type collets 16 shown in FIG. 5A and the chips are allowed to emit light on the submount. Each position is corrected by using a piezo-electric element on the basis of the light-emission point recognition data. Thus, die-bonding can be performed by the two collets in favorable accuracy.

In one embodiment of the present invention, a visual field is opened by using the opposed tilted-type collets as the collets so that a chip bonding state and a collet suction state can be confirmed from right above the chip bonding head.

According to the above embodiment, when the collets of the present invention are used, a bonding state can be confirmed from right above. The positions or bonding situations of the two chips can be monitored by disposing the camera right above the chips.

In one embodiment of the present invention, the collets are eccentric-type collets, the two eccentric-type collets are attached as opposed to each other and the two semiconductor laser chips can be die-bonded at the same time by using the two eccentric-type collets.

According to the above embodiment, the two semiconductor laser chips can be made close to each other while vacuum-sucked. Thus, die-bonding of two chips with a fine gap can be achieved.

That is, in two-chip bonding apparatus according to the present invention, chips are transferred through fixed points onto the submount by using the opposed eccentric-type collets 17 shown in FIG. 5B and the chips are allowed to emit light on the submount. Each position is corrected by using a piezo-electric element on the basis of the light-emission point recognition data. Thus, die-bonding can be performed in favorable accuracy by the two collets.

Therefore, according to the above constitution of the present invention, the resolution for positioning during the fixed-point transfer may be lower than a resolution required in the final position correction. The collets can be moved at a high speed during the fixed-point transfer. Thus, production efficiency can be improved.

When a position resolution is required in the final position correction between the two light-emission points on the submount, a high-resolution and accurate positioning can be achieved by a piezo-electric element.

In one embodiment of the present invention, a pair of collets are provided for each of the intermediate stages and the bonding stage.

According to the two-chip bonding apparatus of the present invention, since a pair of collets are provided both for the intermediate stage and the bonding stage, position correction on the intermediate stage and position correction on the bonding stage can be performed at the same time. Thus, the apparatus tact can be shortened.

To allow a chip to emit light, a probe needs to be brought into contact with the chip surface. In a conventional device, however, it was hard due to a small size of the chip to allow the laser chip surface to be brought into contact with a probe while the chip is being vacuum-sucked by a collet. However, when the collet is made with an energizing material and the collet itself is made with an energizing electrode, the laser chip can be energized and allowed to emit light while vacuum-sucked.

Therefore, in the two-chip bonding apparatus of the present invention, the collet is fabricated with an energizing material and used as an electrode for allowing the chip to emit light. The chip is allowed to emit light by applying a voltage to the collet.

According to the present invention, the collet is lowered while a laser chip is vacuum-sucked and mounted on the submount. The suction collet and the ground side on the submount can be energized so that the chip is allowed to emit light.

In one embodiment of the present invention, the collets are fabricated with a tungsten cobalt carbide (WC—Co) superhard metal sintering material, the collets are used as chip light-emitting electrodes and the chips are allowed to emit light by applying a voltage to the collets.

According to the above embodiment, since the collet is used as a tool for subjecting the semiconductor laser chip to thermo-compression bonding and as an electrode, the collet needs to have low thermal conductivity and high electric conductivity as well as high component rigidity and high component accuracy. Therefore, the inventors of the present invention paid attention to a WC—Co superhard metal sintering material as a material of the collet.

A WC—Co superhard metal sintering material has low thermal conductivity. Since heat does not easily escape through the collet upon thermo-compression bonding of the laser chip, this material is effective as a material of the collet. Due to relatively favorable electric conductivity, this material can also be used as an electrode. Furthermore, since the WC—Co superhard metal sintering material has high rigidity, a fine component having high accuracy and high rigidity can be fabricated by electric discharge machining.

Bonding in higher position accuracy could be achieved by using the method and the apparatus of the present invention as compared with a conventional die-bonding apparatus where chip correction is performed by image processing only on the intermediate stage.

That is, according to the present invention, when two semiconductor laser chips are die-bonded on one submount, the chips can be mounted in high accuracy with a distance between light-emission points of the two chips within a range of 100±2 µm. Furthermore, since final position correction is performed on the submount, collets can be moved at high speed during fixed-point transfer. Thus, productivity can be improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3A is a schematic view showing a process of bonding chips one by one, and

FIG. 3B is a schematic view showing a process of bonding two chips at the same time;

DETAILED DESCRIPTION OF THE PREFERRED EMBODIMENTS

Figure 7:
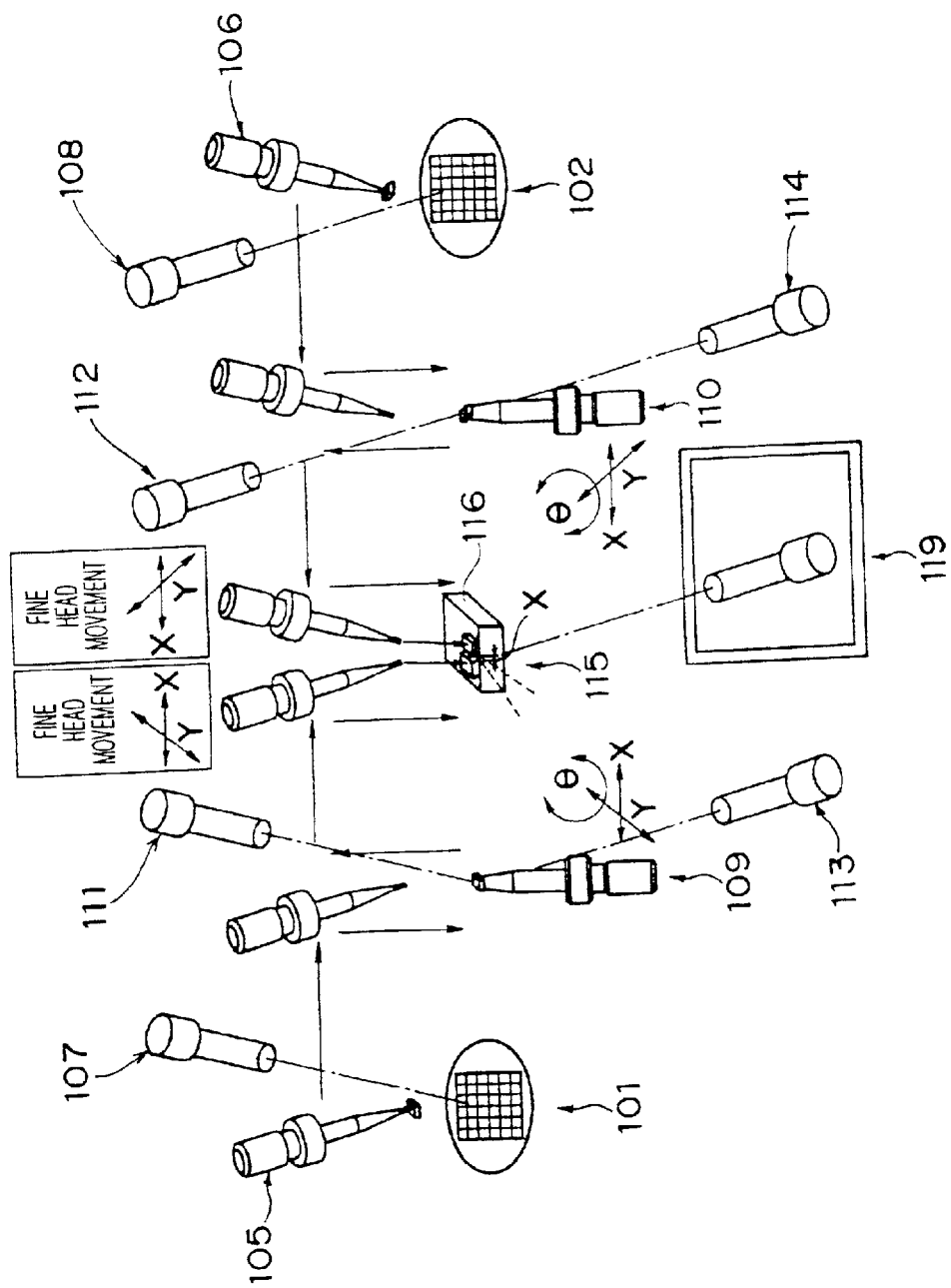
FIG. 7 is a schematic view showing a constitution of the two-chip bonding apparatus of the present invention.
Figure 8:
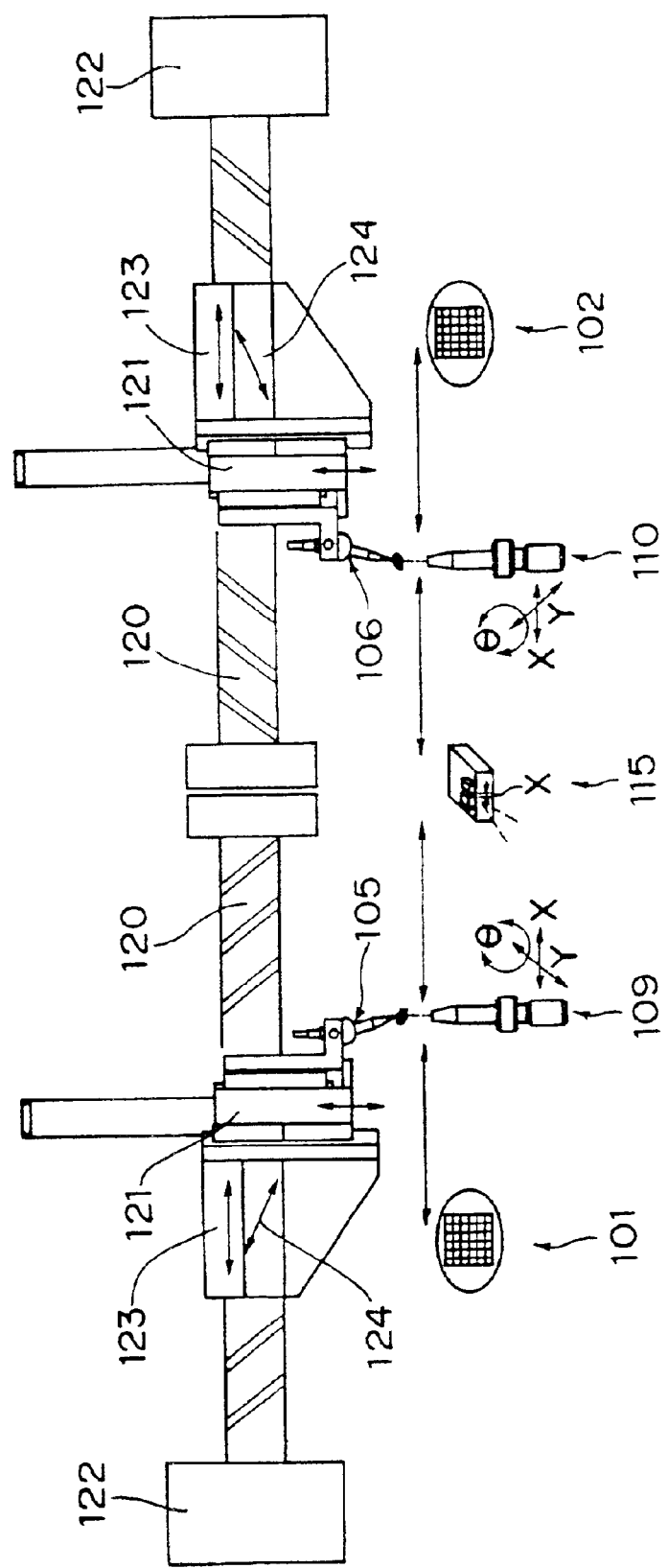
FIG. 8 is a schematic view showing one example of the two-chip bonding apparatus of the present invention.

The operation procedure of bonding a red chip and an infrared chip by using a two-chip bonding apparatus of the present invention shown in FIGS. 7 and 8 includes the following processes:

(1) Positions of chips to be removed from respective wafer sheets 101, 102 for a red chip and an infrared chip are confirmed by image processing and these chips are positioned at prescribed positions;

(2) The chips are lifted by a lifting flash, vacuum-sucked by collets 105, 106 and removed from the wafer sheets 101, 102;

(3) The chips removed from the wafer sheets 101, 102 are transferred through fixed points while vacuum-sucked and then placed on intermediate stages 109, 110;

(4) Chip shift amounts x and y from the prescribed positions of the chips are detected by using profile recognition cameras 111, 112 and angular shift amounts θ are detected by light-emission point recognition cameras 113, 114;

(5) The intermediate stages 109, 110 are moved by shift amounts x, y, θ by an X, Y, Θ drive mechanism (not shown) so that the chip positions are corrected to the prescribed positions;

(6) The chips whose position is corrected are vacuum-sucked by the collets 105, 106 and transferred through fixed points from left and right until positioned to positions above a submount 116 placed on a bonding stage 115; and (7) The collets sucking the red chip and the infrared chip 103, 104 from left and right, respectively, are lowered so that the chips are brought into contact with the submount 116.

The above processes (1)–(6) can be performed for a red chip and an infrared chip at the same time or one by one. In a conventional device, process (7) cannot be performed at the same time. However, this process can be performed at the same time in the present invention.

In the conventional device, bonding is performed here and then the procedure finishes. However, the present invention further includes the following processes:

(8) The red chip 103 and the infrared chip 104 are temporarily placed on the submount 116 while vacuum-sucked by the collets 105, 106;

(9) Contact probes (not shown) are brought into contact with interconnections which are formed on the submount 116 and have continuity with the red chip and the infrared chip and the contact probes and the respective collets are energized to allow the two chips to emit light;

(10) The light-emission points 117, 118 of these two chips are recognized by one camera 119 for recognizing a distance between the light-emission points, the distance between the light-emission points of the two chips and tilting angles of light emission axes of the two light-emission points are detected and compared with prescribed positions and shift amounts from the references are detected;

(11) If there is a shift, electricity is turned off, the collet is raised and the collet is driven to correct the chip position to the reference light-emission point position by applying a voltage matching the shift amount to a piezo-electric element provided to each of collet heads for a red chip and an infrared chip;

(12) After the positions are corrected, the collets are lowered again, processes (9)–(11) are repeated a prescribed number of times and the shifts are corrected until the distance between the light-emission points of the two chips is within the range according to a specification;

(13) The position correction is repeated a prescribed number of times and if specification accuracy cannot be obtained, the bonding procedure is deemed as an error and processed as such;

(14) When the specification accuracy is obtained, the contact probes are raised, the submount 116 is heated while both the collets 105, 106 are lowered and the red chip and the infrared chip 103, 104 are bonded to the submount 116 by thermo-compression bonding;

(15) After bonding is completed, processes (9) and (10) are performed again to confirm position accuracy; and

(16) The collets 105, 106 are raised and returned to the start position of the fixed-point.

In the above process (11), when the position accuracy of the submount 116 and the two chips is not so important, one laser chip position can be used as a reference to correct only the position of the other laser chip. That is, highly accurate correction can be achieved by providing a piezo-electric element adjustment mechanism 123, 124 only to the bonding head of the chip whose position is corrected.

In the process (12), the distance between the light-emission points of the two chips can be determined arbitrarily according to a specification of the semiconductor laser device or the like. The number of times of repetition can also be arbitrarily determined.

Normally, vacuum-suction by the collet is continued during bonding. However, vacuum-suction by the collet can be stopped and the collet can be raised in the middle of heating in the above process (14) so that the heat transmitted to the chip does not escape.

Furthermore, process (16) can be omitted.

Furthermore, position correction on the intermediate stage and position correction on the bonding stage can be performed at the same time by providing a pair of collets both for an intermediate stage and a bonding stage. Thus, the apparatus tact can be shortened.

EXAMPLES

FIG. 7 shows a block diagram of the two-chip bonding apparatus of the present invention. FIG. 8 shows one embodiment of the invention. Examples of the present invention are explained with reference to these drawings, but the present invention is not limited to the following examples.

Example 1

Two-chip bonding processes for fabricating a two-chip semiconductor laser device having a specification distance between the light-emission points of 100 µm by using tilted-type collets according to the present invention are described below.

A. Position Correction on Intermediate Stage

First, a red chip 103 and an infrared chip 104 were removed from a wafer sheet 101 and 102, respectively, by usual pickup processing using a conventional technique as shown in FIG. 7 and placed on respective intermediate stages 109, 110.

Figure 9:
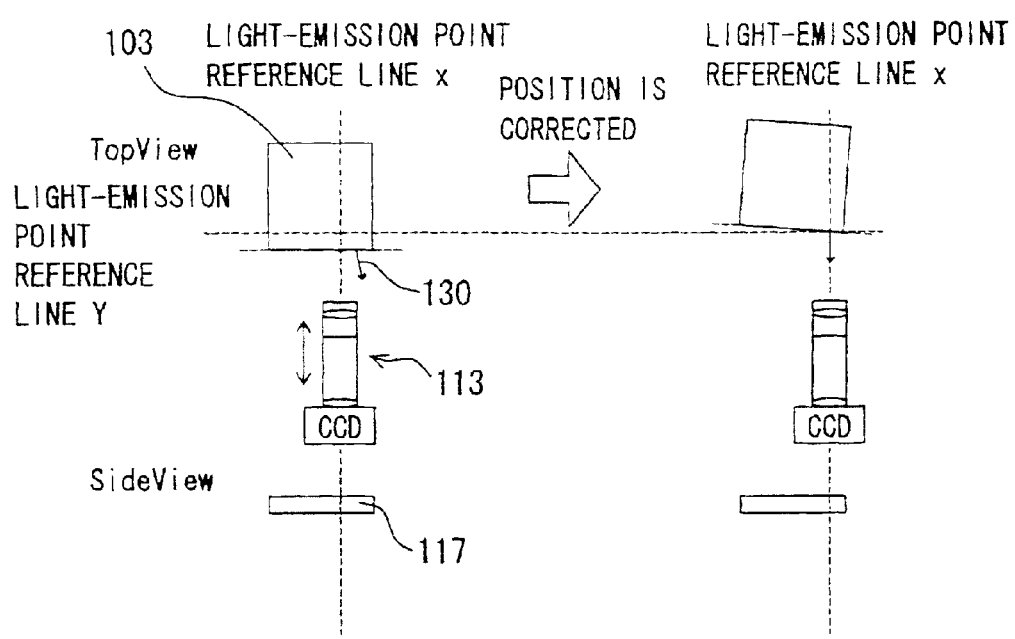
FIG. 9 is a schematic view showing one example of position correction on an intermediate stage according to the present invention.

Subsequently, chip shift amounts x and y from the chip reference position were detected by a profile recognition camera 111, 112. Also, an angular shift amount θ of each light-emission axis from the reference direction was detected by a light-emission point recognition camera 113, 114. The intermediate stage 109, 110 was moved by the shift amounts x, y, θ on the basis of the detection data to correct the chip position to the reference position (FIG. 9).

Here, the direction of the light-emission axis of a laser emitted from the chip is assumed as a Y direction. The vertical direction of the chip is assumed as a Z direction. The direction perpendicular to the YZ plane is assumed as an X direction.

Processes of correcting shifts of the chip position and angle by profile recognition and light-emission axis recognition on the intermediate stage are explained in detail below by using a red chip as an example (FIGS. 10–12).

I. Correction of Shift by Chip Profile Recognition

Figure 10A:
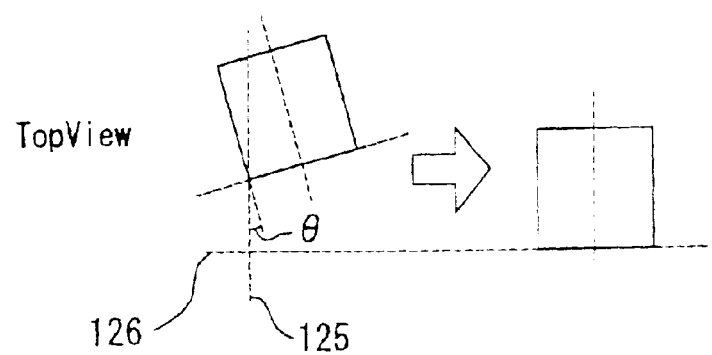
FIGS. 10A–10C are schematic views showing one example of position correction on the intermediate stage according to the present invention.
Figure 10B:
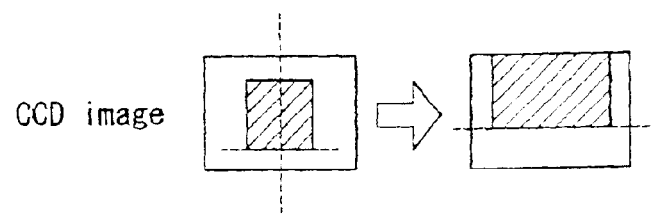
Figure 10C:
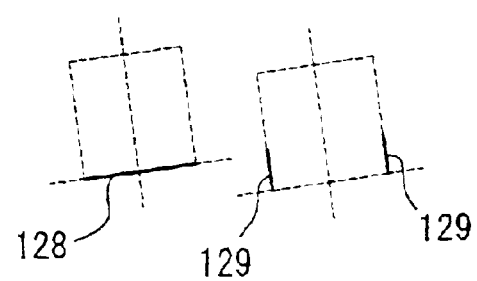

First, chip profile is recognized by using a CCD camera (profile recognition camera 111) capable of recognizing a chip profile from above (FIG. 10A). To make the resolution of the profile recognition camera 111 as high as possible, the magnification is adjusted so that only the vicinity of a laser outgoing end surface of the chip can be enlarged and observed (FIG. 10B). The position of an outgoing surface 128 and both side portions 129 of the chip are detected in the profile (FIG. 10C) and shift amounts x and y from the reference position and angular shift amount θ from the reference direction are calculated. The calculated shift amounts from the reference converted to motor movement amounts. The intermediate stage is moved to the reference position and the reference direction to correct the laser chip position in the X, Y and Θ directions.

II. Correction of Angle by Laser Light-Emission Axis Recognition

The laser outgoing direction 130 may be tilted with respect to the reference direction only with shift correction by profile recognition of the chip shape as shown in FIG. 10. Therefore, angular correction by light-emission axis recognition was further performed.

Figure 11A:
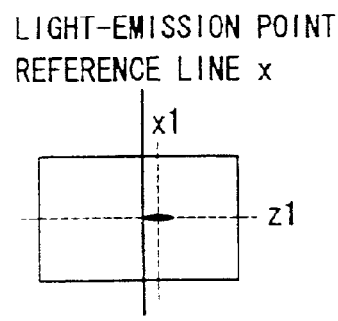
FIGS. 11A–11D are schematic views showing one example of position correction on the intermediate stage according to the present invention.

First, the chip light-emission point position was detected by using a CCD camera (light-emission point recognition camera 113) capable of observing the laser light-emission point 117 from the laser outgoing surface side and a horizontal position $(x_1, z_1)$ on the outgoing surface was determined while the outgoing surface was focused (FIG. 11A). At this time, the origin of the XZ plane is not limited, but was set at the center of the screen here.

Figure 11B:
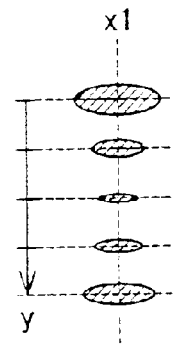
Figure 11C:
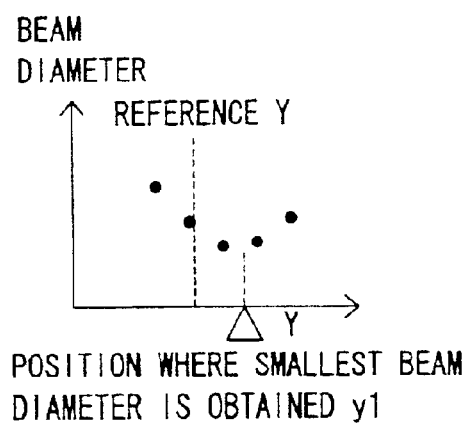
Figure 11D:
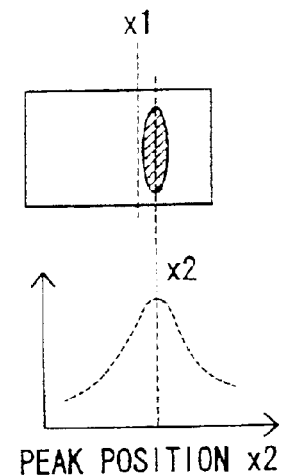
Figure 12A:
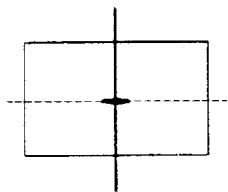
FIGS. 12A–12D are schematic views showing one example of position correction on the intermediate stage according to the present invention.
Figure 12B:
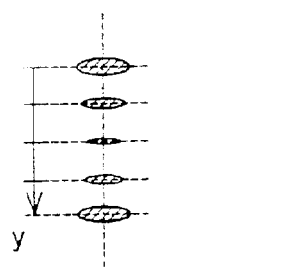
Figure 12C:
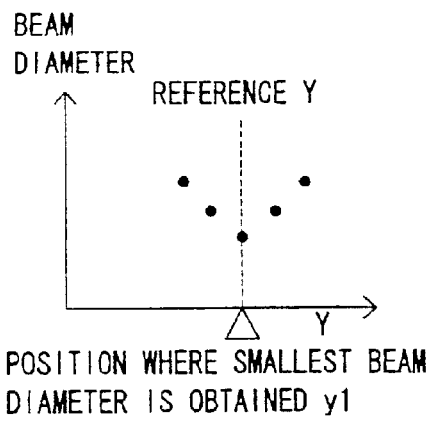
Figure 12D:
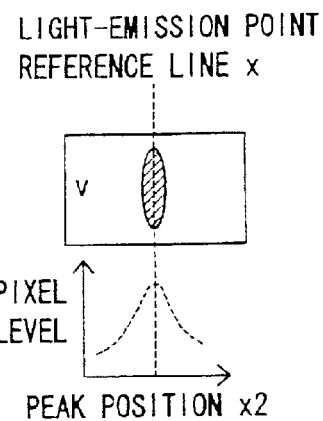

This light-emission point recognition camera 113 can be driven in the Y direction to detect a focused light-emitting position (FIG. 9). Therefore, while the camera was driven by steps in the Y direction, the laser light-emission point was observed and the beam diameter was measured by changing the y value (FIGS. 11B and 11C). Since the beam on the laser outgoing surface is spread laterally along an active layer of the laser chip, the beam shape is long sideways. Therefore, in the present invention, the beam width in a direction perpendicular to the active layer, that is, the Z direction was assumed as a "beam diameter".

Subsequently, on the basis of the measured value obtained as described above, the relationship of the y value and the beam diameter was approximated by the quadratic function by using the least square method. A y value giving the smallest beam diameter in this approximate equation was assumed as $y_1$ (FIG. 11C).

Figure 1:
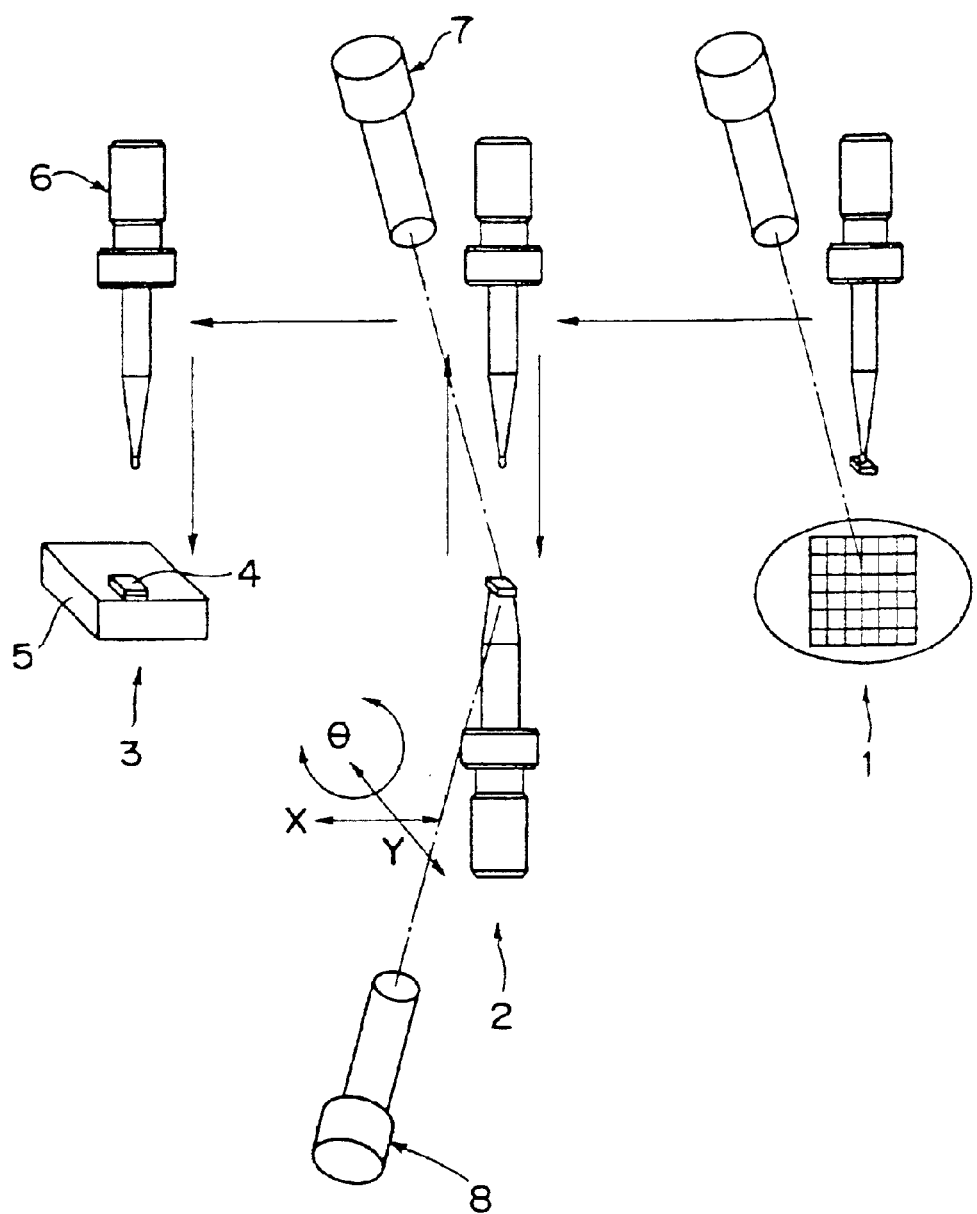
FIG. 1 is a schematic view showing a constitution of a conventional one-chip bonding apparatus.
Figure 2:
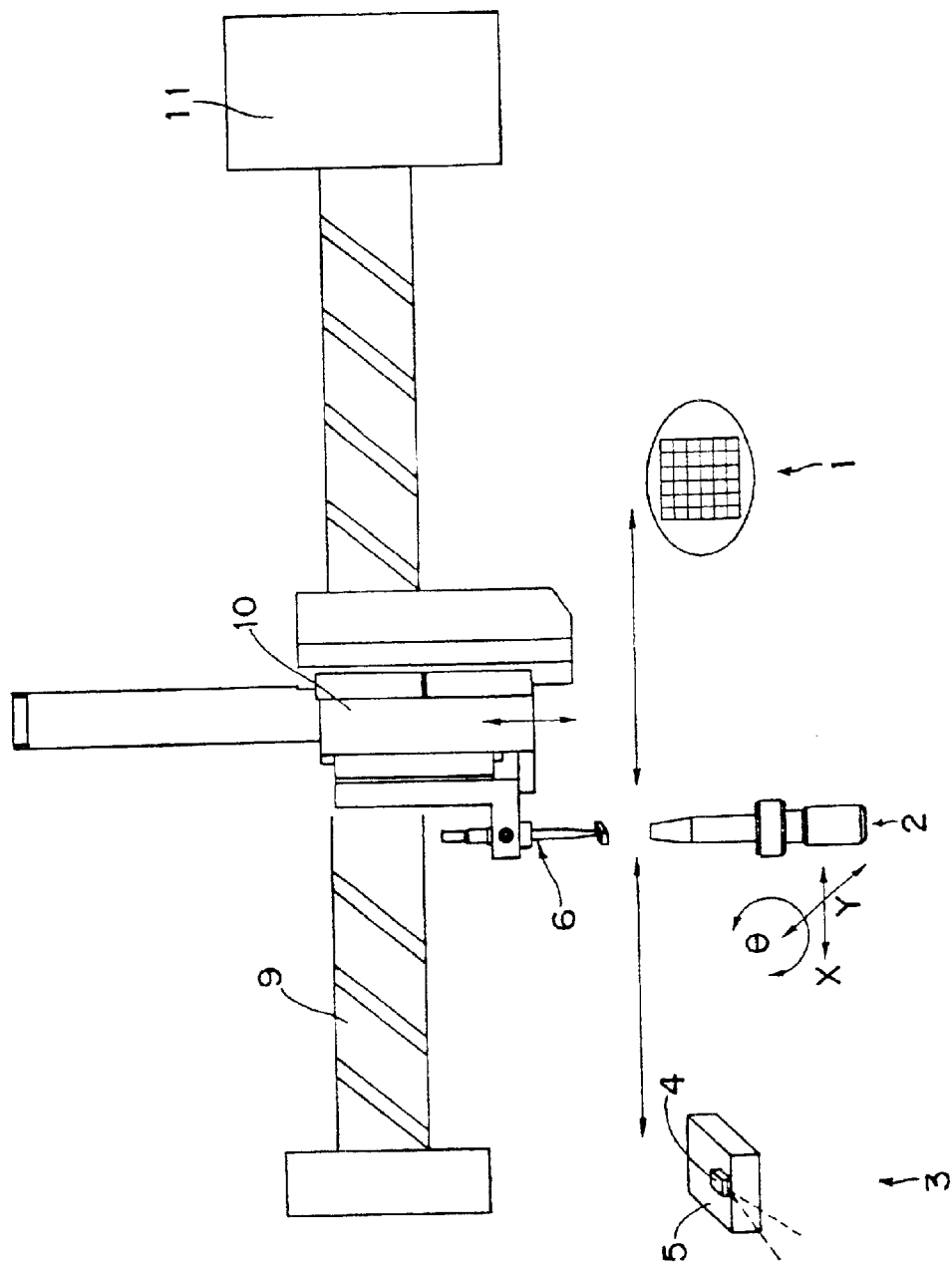
FIG. 2 is a schematic view showing one example of the conventional one-chip bonding apparatus.
Figure 3:
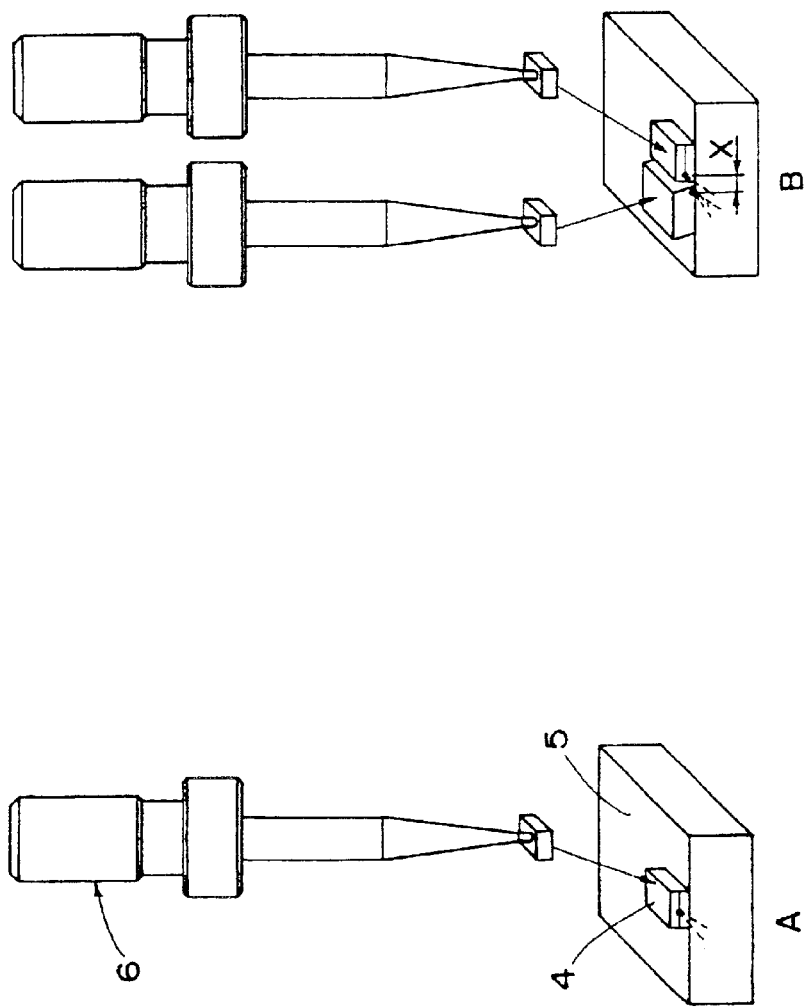
FIG. 3 is schematic views showing two-chip bonding using conventional collets.
Figure 4:
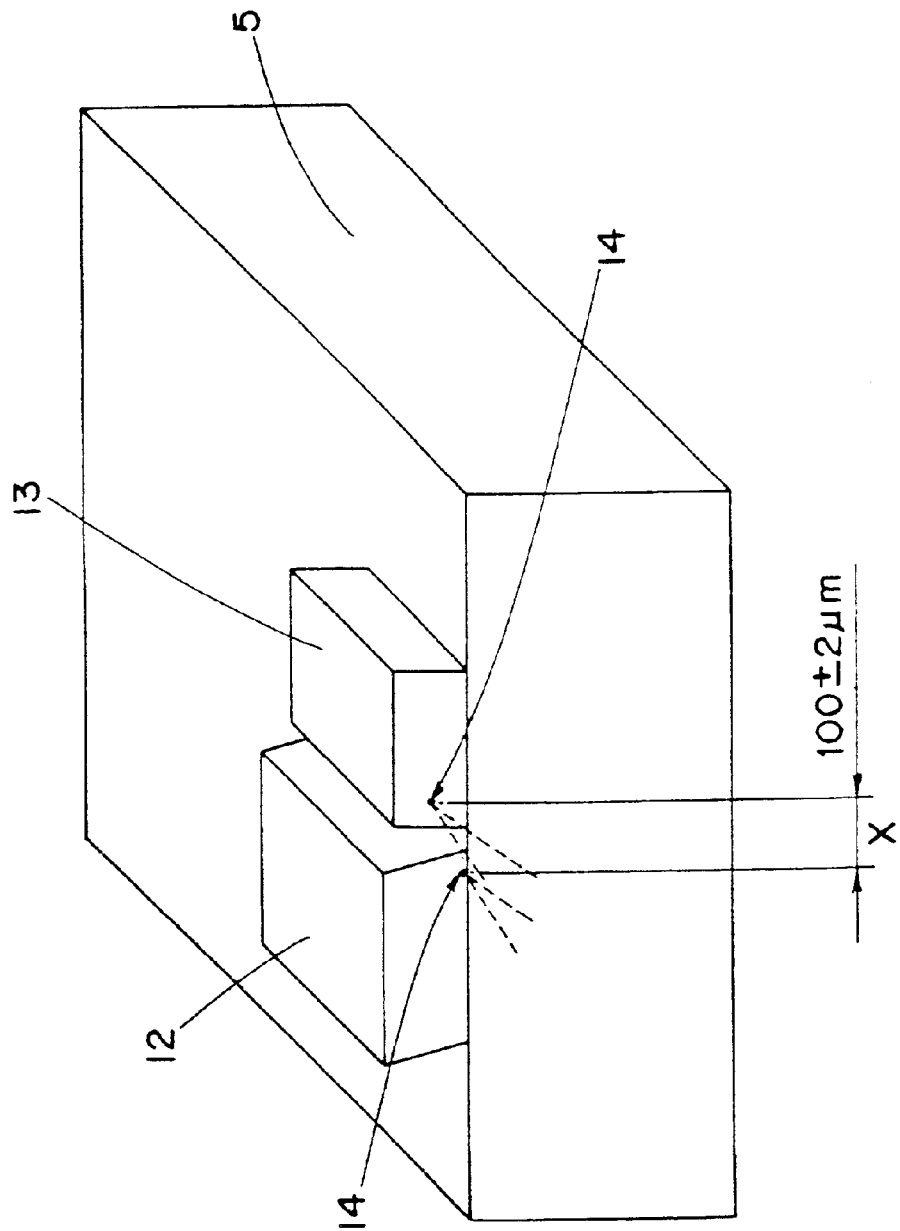
FIG. 4 is an explanatory view showing a bonding situation of a submount, a red laser chip and a infrared laser chip of a two-chip semiconductor laser device.
Figure 5B:
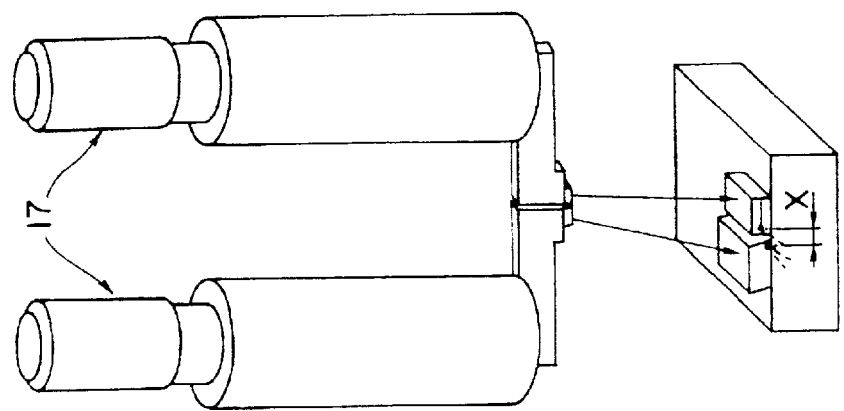
FIG. 5A is a schematic view showing tilted-type collets of the present invention and FIG. 5B is a schematic view showing eccentric-type collets of the present invention.
Figure 5A:
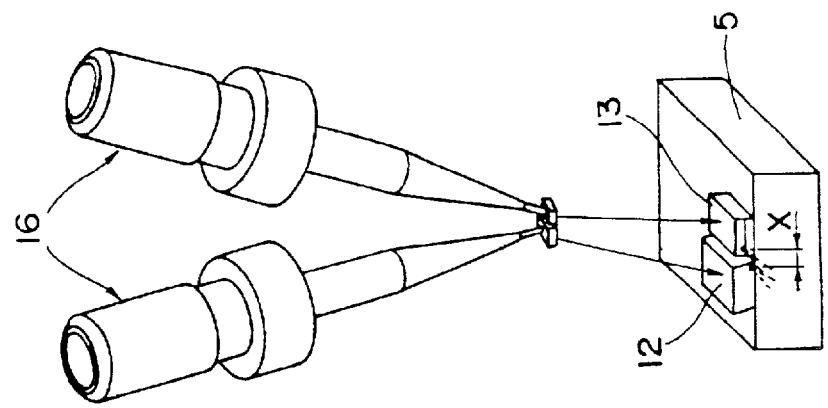
Figure 6:
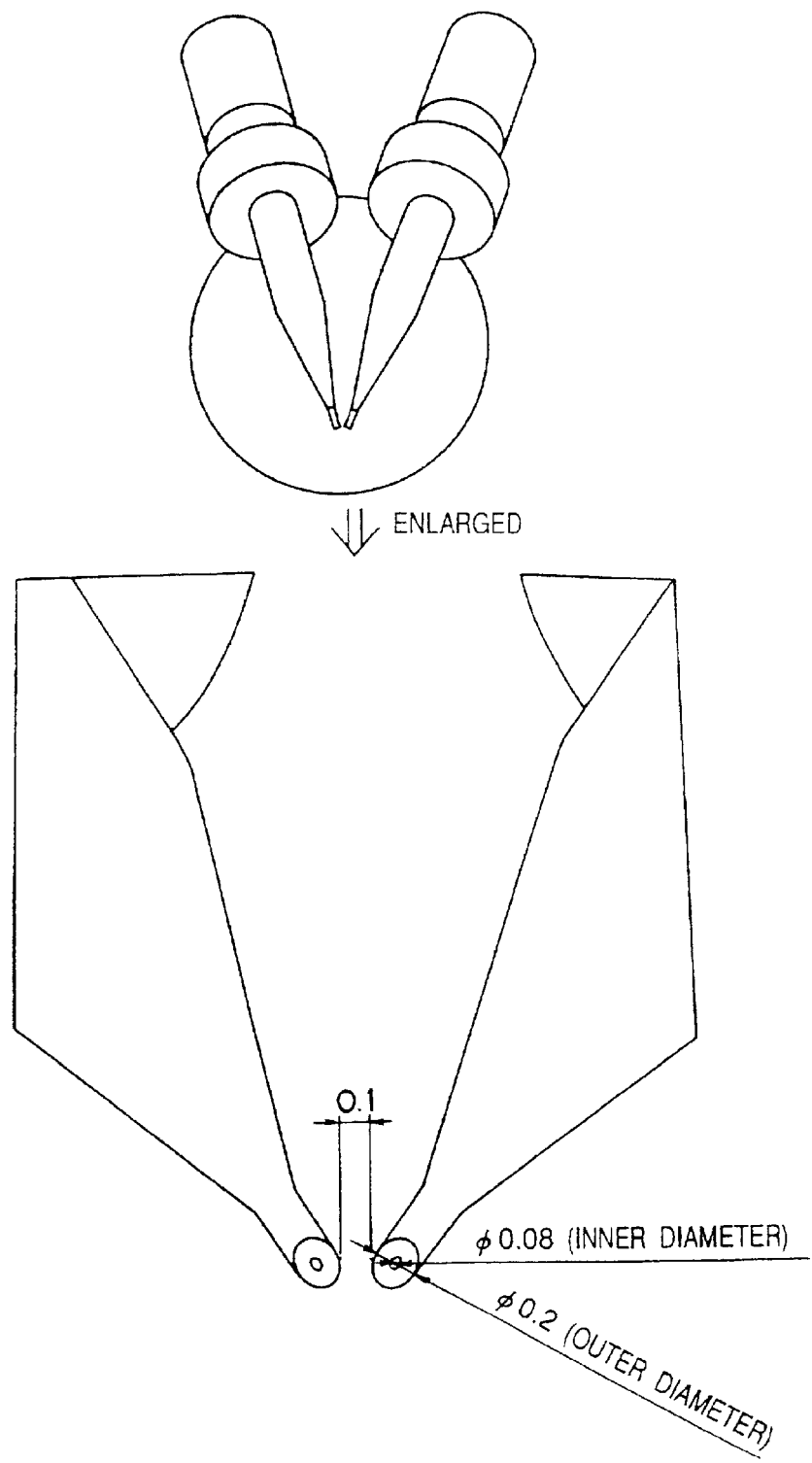
FIG. 6 is an enlarged view showing ends of the tilted-type collets of the present invention.

While the light-emission point camera from the detected $y_1$ was further driven in the Y direction by Δy, the light emitting level was controlled up to the level where the light emitting level was not saturated. The laser light-emission point was observed and the horizontal position $x_2$ on the outgoing surface was detected. A tilting angle θ of the light-emission axis was calculated by using the following equation (1) (FIG. 1D).

$$\Theta = \tan^{-1}\left(\frac{X2 - X1}{\Delta y}\right) \quad (1)$$

Correction amounts were calculated from the relationship of the reference position and detected positions and the intermediate stage 109 was moved in the X, Y and Θ directions.

FIGS. 12A–12D show a state after recognition and correction of the light-emission points when this procedure was repeated and a prescribed convergent value was obtained. Shifts of the infrared chip were also corrected similarly.

The red chip and the infrared chip whose position and angle were corrected were vacuum-sucked by the collets 105, 106 and transferred through fixed points onto the submount 116 placed on a bonding stage from left and right, respectively.

B. Final Position Correction on Bonding Stage

Position correction on the bonding stage is explained in detail below. Methods for performing this correction include absolute position correction, where both the chips are moved to absolute positions with respect to the submount, and relative position correction, where the light-emission point of one chip is used as a reference and only the other chip is moved. In this example, the absolute position correction was performed.

While the red chip and the infrared chip transferred through fixed points to the bonding stage were vacuum-sucked, the collets 105, 106 were lowered. The red chip and the infrared chip 103, 104 were temporarily placed on the submount 116. Then, the respective collets 105, 106 and the ground on the submount 116 were energized and the two semiconductor laser chips 103, 104 were allowed to emit light.

The light-emission points 117, 118 of the two semiconductor laser chips were recognized by a light-emission point CCD camera (camera 119 recognizing a distance between the light-emission points) capable of observing the points from the side of one laser outgoing surface.

Figure 13:
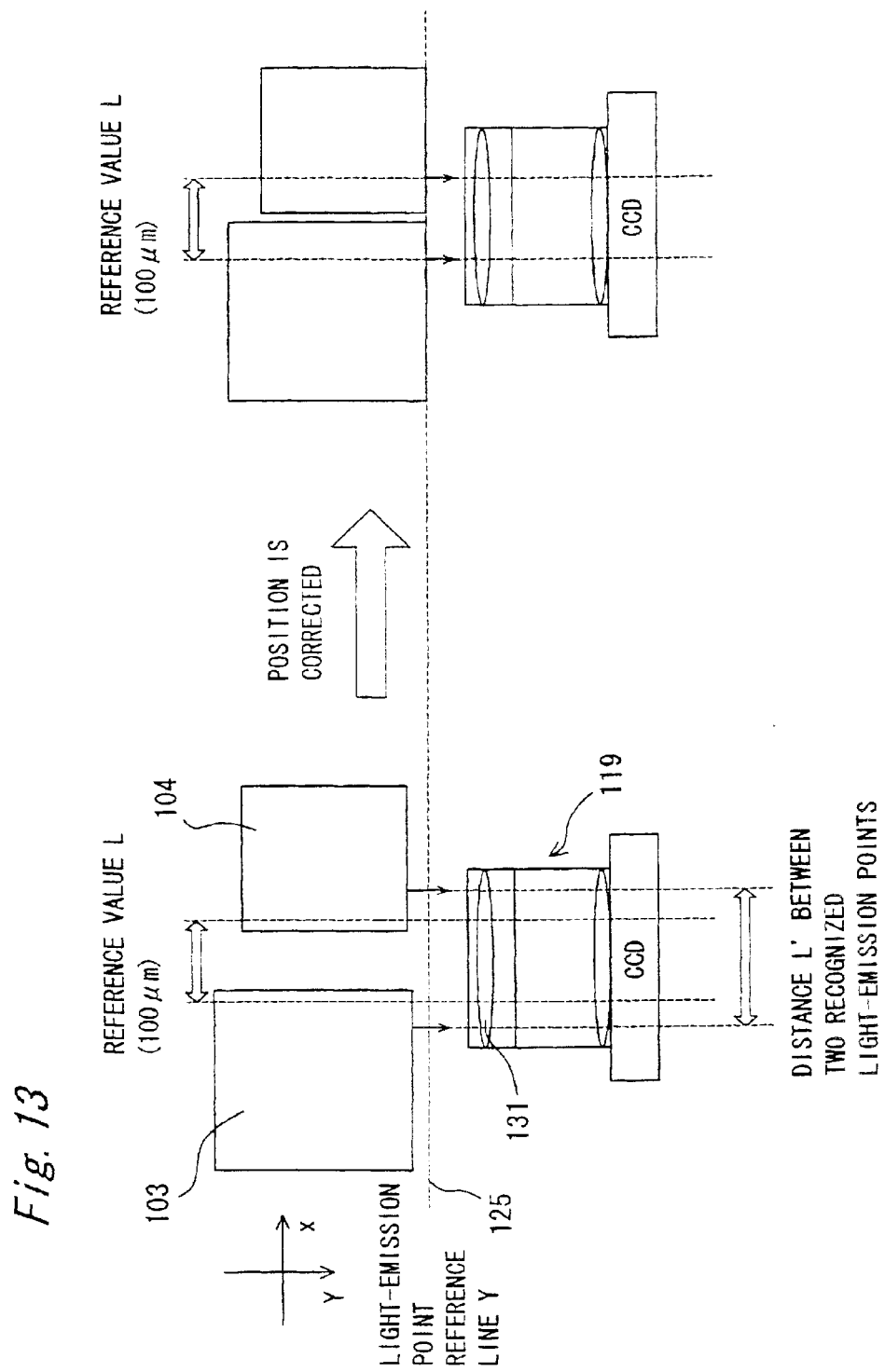
FIG. 13 is a schematic view showing one example of position correction on a bonding stage according to the present invention.

A difference in the Z-direction position recognition due to a difference in the wavelength of each chip was eliminated by using a lens 131 without chromatic aberration as an optical system of this light-emission point CCD camera. The camera 119 recognizing a distance between the light-emission points is constituted so as to be driven in the Y direction to detect a focused light-emitting position (FIG. 13).

Figure 14:
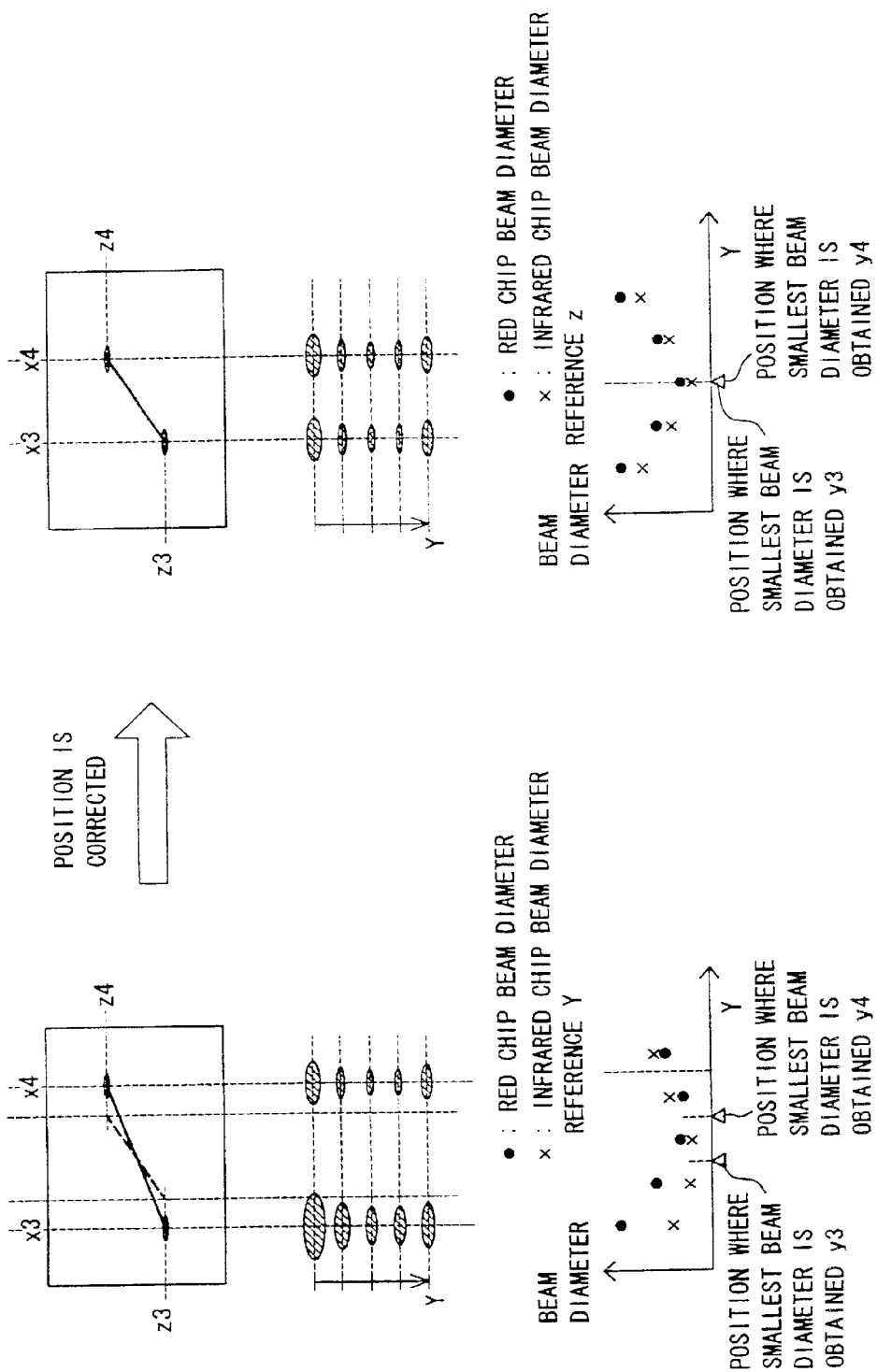
FIG. 14 is a schematic view showing one example of position correction on the bonding stage according to the present invention.
Figure 15:
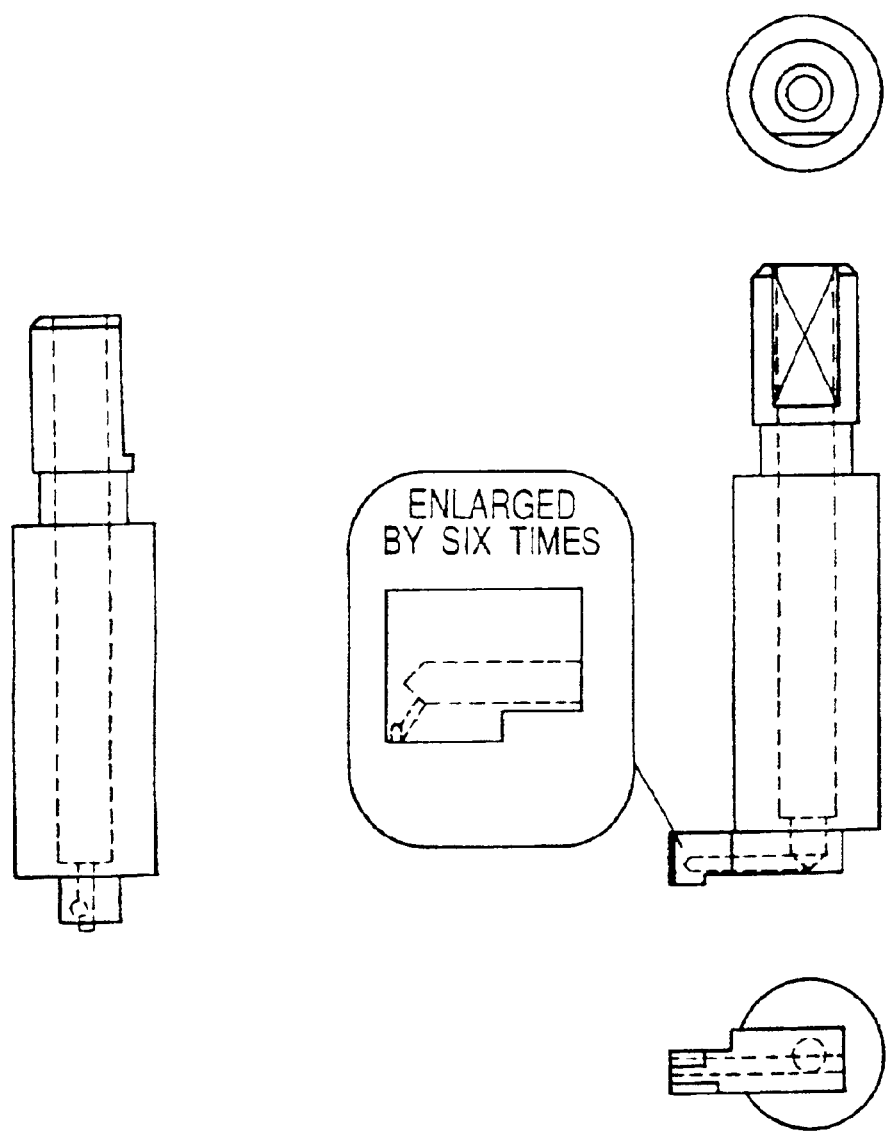
FIG. 15 is a view with detailed dimensions of the eccentric-type collet of the present invention.

The distance between the two light-emission points and the tilting angles of the light-emission axes of the two semiconductor laser chips detected by the camera 119 recognizing a distance between the light-emission points were compared with the reference values and the shift amounts from the reference values were measured. The positions of the two chips were corrected on the basis of the results. FIG. 14 shows a state before and after the position correction by recognition of the distance between the light-emission points.

First, the laser light-emission points 117, 118 were observed by the camera 119 recognizing a distance between the light-emission points. The horizontal positions $(x_3, z_3)$ and $(x_4, z_4)$ with respect to the outgoing surface were detected and the distance L' between the two points were calculated by using the following equation (2).

$$L' = \sqrt{(X4-X3)^2 + (Z3-Z4)^2} \quad (2)$$

Subsequently, while the camera 119 recognizing a distance between light-emission points was driven by steps in the Y direction, the laser light-emission points 117, 118 were observed and the beam diameter was measured by changing the y value (FIG. 14). Subsequently, on the basis the measured value obtained as described above, the relationship between the y value and the beam diameter was approximated by a quadratic function by using the least square method. The y values giving the smallest beam diameter for the red chip and the infrared chip were assumed as $y_3$ and $y_4$, respectively.

Each of the chips was moved in the X and Y directions by a bonding head with a piezo-electric element which can be driven along two axes of the X and Y directions from the two detected light-emission points and the positions were repeatedly corrected until the distance L' between the two points became the reference value L (100±2 μm). Or, correction can be performed so that X matches the reference value.

This procedure was repeated until the prescribed convergent value was obtained and the positions of both the two chips were precisely corrected by a high resolution.

In this example, the positions of both the red chip and the infrared chip were corrected, but, for example, relative position correction, where the red chip is used as a reference and only the infrared chip is corrected, can be performed.

Then, the collets were raised, shifts were corrected by applying a voltage corresponding to the shift amount to the piezo-electric elements provided to the respective bonding heads for the red chip and the infrared chip and the chips were moved to the respective reference light-emission point positions.

When shifts were detected again, it was confirmed that the positions were within prescribed accuracy. Then, bonding was performed.

A two-chip semiconductor laser device having the distance between the light-emission points of 100±2 μm in accuracy was obtained.

Example 2

A procedure similar to Example 1 except for using eccentric-type collets 17 of the present invention as the collets was taken to fabricate a two-chip semiconductor laser device.

A two-chip semiconductor laser device having the distance between the light-emission points of 100±2 μm in accuracy was obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-chip bonding apparatus for die-bonding two semiconductor laser chips 12, 13 on one submount 116, having intermediate stages 109, 110 for correcting positions and directions of the semiconductor laser chips 12, 13, a bonding stage 115 for placing a submount 116 on which the semiconductor laser chips are bonded, means for allowing the two semiconductor laser chips to emit light at the same time on the submount placed on the bonding stage, means for measuring a distance between light-emission points of the two semiconductor laser chips and means for transferring the two semiconductor laser chips through fixed points to prescribed positions on the submount.

2. The two-chip bonding apparatus according to claim 1, which has collets for sucking the semiconductor laser chips, a fixed-point transfer movement mechanism which is connected to collet heads of the collets to move the collets, means for recognizing profiles of the semiconductor laser chips on the intermediate stage, means for recognizing light emission axes of the semiconductor laser chips on the intermediate stages, a drive mechanism for correcting positions and directions of the intermediate stages, means for allowing the two semiconductor laser chips to emit light at the same time on the submount placed on the bonding stage and means for measuring a distance between light-emission points of the two semiconductor laser chips, and which corrects positions of the two semiconductor laser chips on the submount and then performs bonding.

3. The two-chip bonding apparatus according to claim 2, wherein a piezo-electric element precision drive mechanism for fine XY movement is separately connected to the collet heads separately from the fixed-point transfer movement mechanism.

4. The two-chip bonding apparatus according to claim 3, wherein the piezo-electric element precision drive mechanism is driven on the basis of the measured light-emission point distance data.

5. The two-chip bonding apparatus according to claim 2, wherein the collets are tilted-type collets, the two tilted-type collets are attached as opposed to each other and the two semiconductor laser chips can be die-bonded at the same time by using the two tilted-type collets.

6. The two-chip bonding apparatus according to claim 2, wherein a visual field is opened by using the opposed tilted-type collets as the collets so that a chip bonding state and a collet suction state can be confirmed from right above the chip bonding head.

7. The two-chip bonding apparatus according to claim 2, wherein the collets are eccentric-type collets, the two eccentric-type collets are attached as opposed to each other and the two semiconductor laser chips can be die-bonded at the same time by using the two eccentric-type collets.

8. The two-chip bonding apparatus according to claim 5, wherein a pair of collets are provided for each of the intermediate stages and the bonding stage.

9. The two-chip bonding apparatus according to claim 2, wherein the collets are fabricated with a tungsten cobalt carbide (WC—Co) superhard metal sintering material, the collets are used as chip light-emitting electrodes and the chips are allowed to emit light by applying a voltage to the collets.

* * * * *